US012764873B2

(12) United States Patent
Feisst et al.

(10) Patent No.: US 12,764,873 B2
(45) Date of Patent: Oct. 13, 2026

(54) PRINTED CIRCUIT BOARD ASSEMBLY

(71) Applicant: Murrelektronik GmbH, Oppenweiler (DE)

(72) Inventors: Heiko Feisst, Oppenweiler (DE); Jan Maier, Oppenweiler (DE); Tim Roolf, Oppenweiler (DE); Henrik Ruf, Oppenweiler (DE)

(73) Assignee: Murrelektronik GmbH, Oppenweiler (DE)

( * ) Notice: Subject to any disclaimer, the term of this patent is extended or adjusted under 35 U.S.C. 154(b) by 150 days.

(21) Appl. No.: 18/637,579

(22) Filed: Apr. 17, 2024

(65) Prior Publication Data

US 2024/0357753 A1 Oct. 24, 2024

(30) Foreign Application Priority Data

Apr. 18, 2023 (DE) ..................... 20 2023 102 004.6

(51) Int. Cl.
*H05K 5/00* (2025.01)
*H05K 5/06* (2006.01)

(52) U.S. Cl.
CPC ........... *H05K 5/0034* (2013.01); *H05K 5/064* (2013.01)

(58) Field of Classification Search
CPC .. H05K 5/0034; H05K 5/064; H05K 7/20454; H05K 1/0203; H05K 3/22; H05K 3/285; H05K 2201/2036; H05K 1/0204; H05K 3/284; H01G 2/106; H01G 2/08; H01G 2/10; H01G 9/0003; H01G 9/06
See application file for complete search history.

(56) References Cited

U.S. PATENT DOCUMENTS 5,161,092 A 11/1992 Smith et al.
5,268,814 A * 12/1993 Yakubowski ......... H10W 40/47 174/547
6,057,593 A * 5/2000 Iovdalsky ............. H10W 44/20 257/659
6,549,409 B1 * 4/2003 Saxelby, Jr. ......... H05K 1/0203 174/548
6,614,108 B1 * 9/2003 Sanftleben ............. H05K 5/064 257/710
6,730,731 B2 * 5/2004 Tobita ..................... D01F 9/145 423/447.2

(Continued)

FOREIGN PATENT DOCUMENTS

DE 2919058 A1 11/1980
DE 102012210572 A1 12/2013

(Continued)

*Primary Examiner* — Allen L Parker
*Assistant Examiner* — Martin Antonio Asmat Uceda
(74) *Attorney, Agent, or Firm* — Dilworth IP, LLC

(57) ABSTRACT

A printed circuit board assembly for a field bus device is described, comprising a housing, a printed circuit board, and at least one electronic component fastened to the printed circuit board. The printed circuit board is arranged in the housing. The housing has at least one bearing surface on which a gap filler is arranged, against which the electronic component rests so that the printed circuit board is mounted in the housing via the electronic component and the gap filler. A potting compound is provided, which covers the printed circuit board and contacts the gap filler.

20 Claims, 1 Drawing Sheet

(56) References Cited

U.S. PATENT DOCUMENTS

| | | | | |
|---|---|---|---|---|
| 8,059,407 | B2 * | 11/2011 | Eglinger | B60R 16/0239 361/679.01 |
| 8,130,496 | B2 * | 3/2012 | Dong | B29C 45/0005 174/521 |
| 8,531,841 | B2 * | 9/2013 | Lee | H05K 7/209 361/720 |
| 8,879,263 | B2 * | 11/2014 | Gunderson | H05K 5/0256 361/720 |
| 9,334,950 | B2 * | 5/2016 | Paielli | F16H 57/0405 |
| 9,497,875 | B2 * | 11/2016 | Henniger | H05K 3/306 |
| 9,642,256 | B2 * | 5/2017 | Olivieri | H05K 7/20445 |
| 9,661,773 | B2 | 5/2017 | Mijac et al. | |
| 9,839,150 | B2 * | 12/2017 | Henniger | B60R 16/0231 |
| 10,083,885 | B1 * | 9/2018 | Donofrio | F21V 19/003 |
| 2010/0097775 | A1 | 4/2010 | Kashiwazaki et al. | |
| 2011/0026226 | A1 * | 2/2011 | Zheng | H05K 7/209 361/709 |
| 2011/0068737 | A1 * | 3/2011 | Rai | H05K 7/142 361/720 |
| 2011/0114383 | A1 * | 5/2011 | Covers | B29C 39/006 174/521 |
| 2015/0342071 | A1 * | 11/2015 | Mijac | H05K 5/0056 361/752 |
| 2017/0018367 | A1 * | 1/2017 | Werker | H01G 9/06 |
| 2020/0075436 | A1 * | 3/2020 | Franiatte | H10W 70/611 |
| 2020/0413553 | A1 * | 12/2020 | Gipson | H05K 5/061 |
| 2021/0037638 | A1 | 2/2021 | Knill et al. | |

FOREIGN PATENT DOCUMENTS

| | | | | |
|---|---|---|---|---|
| DE | 202010018233 | U1 * | 1/2015 | H05K 3/284 |
| DE | 102014007443 | A1 | 11/2015 | |
| DE | 102016206521 | B3 | 8/2017 | |
| DE | 112019001838 | T5 | 12/2020 | |

* cited by examiner

PRINTED CIRCUIT BOARD ASSEMBLY

FIELD OF THE DISCLOSURE

Embodiments of the present disclosure relate to a printed circuit board assembly for a field bus device.

BACKGROUND

The prior art discloses field bus devices, among others, which have a field bus housing in which a printed circuit board is mounted. Usually, the printed circuit board is positioned in the housing via supports, a potting compound being then introduced into the housing to completely enclose the printed circuit board. Electronic components arranged on the printed circuit board are then also enclosed by the potting compound, which ensures that the electronic components are protected to the outside, in particular against moisture. In other words, both the printed circuit board and the electronic components arranged on the printed circuit board are then embedded in the potting compound.

It has been found that it is disadvantageous that the heat has to be dissipated via the potting compound to prevent overheating of the electronic components during operation.

The object of the present disclosure is to provide a printed circuit board assembly which ensures an improved heat dissipation.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

According to the present disclosure, the object is achieved by a printed circuit board assembly for a field bus device, comprising a housing, a printed circuit board, and at least one electronic component fastened to the printed circuit board. The printed circuit board is arranged in the housing. The housing has at least one bearing surface on which a gap filler is arranged, against which the electronic component rests so that the printed circuit board is mounted in the housing via the electronic component and the gap filler. A potting compound is provided, which covers the printed circuit board and contacts the gap filler.

The basic idea is to couple the electronic component directly to the housing via the gap filler, as a result of which a heat conduction to the housing via the gap filler is established. The gap filler also serves as a rest for the potting compound, as the potting compound cannot completely penetrate into the housing during the subsequent potting process, but only as far as the gap filler. In this respect, two functions are simultaneously realized by means of the gap filler, namely a barrier for the potting compound and a thermal connection of the at least one electronic component.

As the printed circuit board is mounted in the housing via the electronic component and the gap filler, the electronic component is arranged between the printed circuit board and the gap filler. In other words, the gap filler is arranged on a bearing surface of the housing, the electronic component arranged on the printed circuit board being connected to the housing, in particular to the bearing surface of the housing, via the gap filler.

In a sectional view of the printed circuit board assembly, a housing portion is thus produced which includes the bearing surface of the housing on which the gap filler is arranged, the electronic component which is arranged on the printed circuit board with its side opposite the gap filler being arranged on the gap filler. The potting compound is arranged on the other side of the printed circuit board, i.e. that one which faces away from the electronic component. In other words, the electronic component is arranged between the gap filler and the printed circuit board, whereas the potting compound is applied in a flat manner to the side of the printed circuit board which faces away from the gap filler.

Therefore, the potting compound does not entirely cover the electronic component. This is due to the fact that the electronic component is arranged on the side of the printed circuit board which faces away from the potting compound.

Gap fillers are generally known. Usually, gap fillers are used to fill voids, as the name already suggests. The gap filler can be used to entirely and permanently fill slits produced by tolerances, total height differences or different expansion coefficients of the materials used. In the present case, the gap filler is purposefully used as a connecting material to mount and thermally connect the electronic component and thus the printed circuit board in the housing and to form a barrier for the potting compound. Therefore, the gap filler is usually electrically non-conductive.

As the gap filler serves as a barrier for the potting compound or the potting compound contacts the gap filler, a cavity is produced. This ensures that no large amount of potting compound is required, as a result of which the printed circuit board assembly can be formed more easily compared to printed circuit board assemblies in which the entire housing is filled with the potting compound. This is advantageous in particular for moving parts such as a robot head, as less mass is to be accelerated.

In addition, this also results in advantages as to the recycling of the printed circuit board assembly and in cost advantages in the manufacture, as less potting compound is used.

The gap filler may have been applied onto the bearing surface as a paste or a prefabricated pad.

One aspect provides that the electronic component is fastened to the bearing surface by means of the gap filler. This ensures that the printed circuit board is arranged in the correct position in the housing. A slipping or shifting of the printed circuit board in the housing can thus be prevented. The gap filler thus ensures that the electronic component is firmly fastened to the housing.

The gap filler is in particular adhesive, so that the printed circuit board is bonded to the bearing surface via the electronic component by means of the gap filler. The printed circuit board is thus mechanically connected to the housing via the adhesive gap filler, via which the electronic component fastened to the printed circuit board is connected to the housing, in particular to the bearing surface of the housing.

The gap filler can thus be applied to the bearing surface, the mechanical connection being simultaneously realized as the gap filler itself is already adhesive. This applies analogously to the connection of the electronic component, which is also applied to the adhesive gap filler, the electronic component being thus fixed.

It is also within the meaning of the present disclosure if connections are provided on the housing in addition to the gap filler, for example snap hooks or screws or similar.

A further aspect provides that the gap filler is thermally conductive and connects the electronic component to the housing in a thermally conductive manner. A defined cooling path is thus provided, which is ensured, among other things, by the properties of the gap filler which has a high thermal conductivity. The thermal energy released by the electronic component can thus be dissipated with a lower temperature difference to the housing, from which the heat is released to the surroundings. Due to the thermal conductivity of the gap filler, in particular compared to the thermal conductivity of the further components, the thermal power loss produced is purposefully directed to via the gap filler to the housing, from which the thermal power loss can be dissipated, such that the electronic component is cooled. It is thus possible to effectively prevent overheating in the housing.

Basically, the gap filler thus ensures that it is not necessary to use a thermally conductive potting compound to dissipate heat, i.e. a specifically modified potting compound having a higher thermal conductivity due to additives. This allows costs to be saved accordingly.

A further aspect provides that the gap filler is elastic, so that the gap filler acts as a mechanical damper. Due to its intrinsic elasticity, the gap filler can partially dampen vibrations and/or shocks occurring during operation, so that these are only transmitted to the printed circuit board and the electronic component in a damped manner, as a result of which both the printed circuit board and the electronic component fastened thereto are better protected against shocks or vibrations.

The gap filler is for example made of an elastomer. A silicone elastomer can be used for this purpose. The elastomer generally ensures that the gap filler has the elastic properties and can thus act as a damper.

Alternatively, it may be provided that the gap filler is made of a thermoset material, in particular a polyurethane or an epoxide. The thermoset material is particularly suitable for applications in which it is ensured that no shocks and/or vibrations occur during operation, so that the gap filler does not have to act as a mechanical damper.

Irrespective of the specific material, it may be provided that the gap filler is provided with a thermally conductive additive. The thermally conductive additive ensures that the gap filler has the desired thermal properties to dissipate the heat generated by the electronic component. In particular, the thermally conductive additive can be used to purposefully adjust the thermal conductivity of the gap filler.

The thermally conductive additive is for example a ceramic powder, in particular aluminum oxide, zinc oxide or boron nitride, or a mineral material, in particular quartz sand or quartz powder.

As the gap filler is only used to connect the electronic component, but not to embed the entire printed circuit board, the costs can be kept low(er) despite the use of the thermally conductive additive, as only a relatively small volume is provided with the thermally conductive additive.

The potting compound in particular entirely covers an upper side of the printed circuit board, which is opposite to a lower side of the printed circuit board to which the electronic component is fastened. Therefore, the potting compound does not entirely enclose the electronic component. In this respect, generally less potting compound may be provided, which allows the costs for manufacturing the printed circuit board assembly to be reduced accordingly.

According to one aspect, the potting compound seals the electronic component to the outside. The potting compound therefore extends up to the gap filler.

Generally, the housing may be pot-shaped and comprise a housing bottom and sidewalls. In other words, the housing has an open side via which the printed circuit board can be introduced into the housing. During the manufacture of the printed circuit board assembly, the gap filler can first be applied to the bearing surface, so that the printed circuit board is then placed onto the gap filler via the electronic component. If the gap filler is designed to be adhesive, the printed circuit board is thus already fastened to the housing. The potting compound can finally be applied to the printed circuit board, the potting compound covering the upper side of the printed circuit board which faces towards the open side of the pot-shaped housing. The potting compound can run down laterally along the printed circuit board to additionally partially cover the side of the printed circuit board and the gap filler, a space being thus sealed to the outside in which the electronic component is at least partially located.

For example, the pot-shaped housing has five walls, namely the housing bottom and four sidewalls.

The bearing surface may be parallel to the housing bottom. The bearing surface may be provided on the housing bottom or separately to the housing bottom, a simple design being such that the bearing surface is parallel to the housing bottom. This is in particular advantageous if the housing is a pot-shaped housing having one open side, via which the printed circuit board is inserted. The open side of the pot-shaped housing is usually opposite to the housing bottom.

The housing may have a shoulder portion which is provided in a transition area from the housing bottom to at least one of the sidewalls, the bearing surface being formed on the shoulder portion. The shoulder portion ensures that the printed circuit board is spaced apart from the housing bottom, as a result of which a correspondingly large space can be formed between the printed circuit board and the housing bottom, which is suitable for the accommodation of electronic components.

If the potting compound and the gap filler are provided, this space can be sealed to the outside in a correspondingly easy manner, such that it is possible to arrange moisture-sensitive components in the space, which in particular can protrude from the printed circuit board into the space.

The printed circuit board may be mounted in the housing spaced apart from the sidewalls. This ensures the presence of a slit between the printed circuit board and the housing, in particular the sidewalls of the housing. This slit can be closed by the potting compound which runs from the upper side of the printed circuit board along the sidewalls towards the gap filler.

The gap filler may have a higher thermal conductivity than the potting compound, such that the heat can be purposefully conducted via the gap filler.

Therefore, it is basically provided that the housing is not fully filled with a potting compound, as the cavity is formed between the housing bottom and the printed circuit board. The potting compound provided on the upper side of the printed circuit board partially runs along the sidewalls of the housing, in particular up to the gap filler which forms the sealing along with the potting compound.

The housing may have connection openings via which the electronic components on the printed circuit board or other components can be connected. Preferably, this is carried out before the potting compound has been introduced into the housing.

The housing may also have at least one opening for a liquid cooling, preferably two openings.

The housing may have structures on the exterior side, which favor the release of thermal energy. This in particular includes shapes which increase the surface area, such as ribs.

BRIEF DESCRIPTION OF THE DRAWING

Further advantages and features of the present disclosure will become apparent from the description below and from the FIGURE to which reference is made.

DETAILED DESCRIPTION

Figure 1:
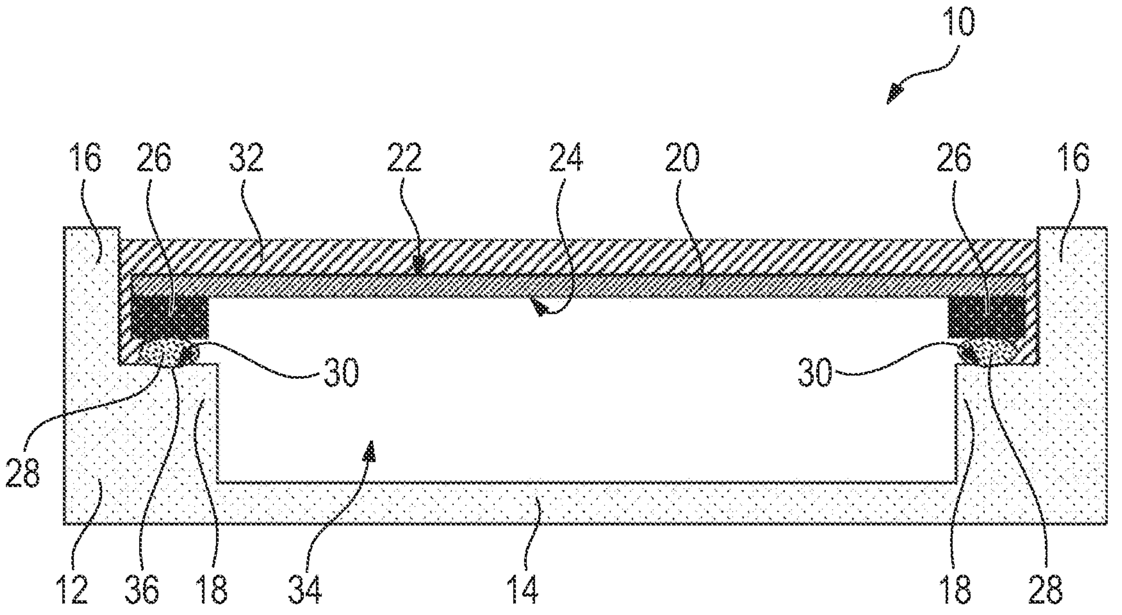
FIG. 1 shows a schematic sectional view of the printed circuit board assembly according to the present disclosure.

A printed circuit board assembly 10 is shown in FIG. 1, which can be used in a field bus device.

The printed circuit board assembly 10 comprises a pot-shaped housing 12 having a housing bottom 14 and sidewalls 16, i.e. four sidewalls 16, for example. In this respect, the pot-shaped housing 12 has one open side which is opposite to the housing bottom 14.

In the embodiment shown, the housing 12 has a shoulder portion 18 which is provided in a transition area from the housing bottom 14 to the sidewalls 16. In this respect, the cross-section of the housing 12 has a step-like side, as shown in FIG. 1.

Furthermore, the printed circuit board assembly 10 comprises a printed circuit board 20 having an upper side 22 and a lower side 24 which are opposite to each other. The lower side 24 of the printed circuit board 20 thus faces towards the housing bottom 14, whereas the upper side 22 of the printed circuit board 20 faces towards the open side of the pot-shaped housing 12.

In addition, the printed circuit board assembly 10 comprises at least one electronic component 26 which is mounted to the printed circuit board 20, in particular to the lower side 24.

The printed circuit board 20 is also mounted on the housing 12 in that the printed circuit board 20 is mounted on a bearing surface 30 of the housing 12 via the electronic component 26 and a gap filler 28.

The gap filler 28 can be adhesive, such that the printed circuit board 20 is bonded to the bearing surface 30 via the electronic component 26 by means of the gap filler 28. This results in a mechanical fastening of the printed circuit board 20 in the housing 12.

In the embodiment shown, the bearing surface 30 is formed on the shoulder portion 18, the bearing surface 30 extending parallel to the housing bottom 14.

Basically, the gap filler 28 can be elastic and be made of an elastomer, for example, the gap filler 28 thus simultaneously acting as a mechanical damper such that the printed circuit board 20 and the electronic component 26 fastened thereto are protected against shocks and/or vibrations.

If it is not necessary that the gap filler 28 simultaneously acts as a mechanical damper, the gap filler 28 can also be made of a thermoset material. This may be the case if the printed circuit board assembly 10 is used in a device which is not exposed to shocks or vibrations during operation.

The FIGURE further shows that the printed circuit board assembly 10 has a potting compound 32 which covers, in particular fully covers the upper side 22 of the printed circuit board 20, among others. The potting compound 32 can have a thickness such that a flat surface is formed, i.e. the potting compound 32 extends up to the edge of the housing 12. Alternatively, the sidewalls 16 can protrude beyond the upper side of the potting compound 32, thus forming a step, as shown in the FIGURE.

The printed circuit board 20 is in particular spaced apart from the sidewalls 16 of the housing 12, such that a gap is provided between the printed circuit board 20 and the sidewalls 16, which can be filled by the potting compound 32. The potting compound 32 thus extends along the slit between the sides of the printed circuit board 20 and the sidewalls 16 towards the housing bottom 14 and up to the gap filler 28. The potting compound 32 thus adjoins the gap filler 28, such that the latter is contacted by the potting compound 32.

The potting compound 32 entirely seals a space 34 to the outside, which at least partially accommodates the electronic component 26. This space 34 may also be referred to as cavity or receiving space. Basically, further electronic components (not shown here) can be arranged in the space 34.

The space 34 is delimited by the printed circuit board 20, in particular the lower side 24 thereof, the housing bottom 14, the sidewalls 16, the electronic component 26 and the gap filler 28.

This ensures that the space 34 in which the electronic component 26 is partially accommodated, is sealed to the outside, in particular via one side. The electronic component 26 is generally sealed to the outside as the electronic component 26 partially protrudes into the sealed space 34 and is partially limited by the gap filler 28 and the potting compound 32.

As the space 34 is a cavity, the mass of the entire printed circuit board assembly 10 is accordingly low, which has a positive effect on cases of application in which the printed circuit board assembly 10 is arranged on a component, a robot part, for example.

In addition, the gap filler 28 can be thermally conductive, for example due to a thermally conductive additive 36 such as a ceramic powder, in particular aluminum oxide, zinc oxide or boron nitride, or a mineral material, in particular quartz sand or quartz powder. The thermally conductive additive 36 can be particulates.

It is thus ensured that the gap filler 28 establishes a thermal connection of the electronic component 26 to the housing 12, as a result of which heat generated by the electronic component 26 during operation is transferred to the housing 12 via the gap filler 28. The heat can be released from the housing to the surroundings accordingly.

The gap filler 28 thus has at least two functions, as the gas filler 28 serves for the purposeful thermal connection of the electronic component 26 to the housing 12 and simultaneously seals the electronic component 26 to the outside.

The invention claimed is:

1. A printed circuit board assembly for a field bus device, comprising a housing, a printed circuit board, and at least one electronic component fastened to the printed circuit board, the printed circuit board being arranged in the housing, the housing being formed in a pot shape and has a housing bottom and sidewalls, the housing having a shoulder portion which is provided in a transition area from the housing bottom to at least one of the sidewalls, and the housing having at least one bearing surface on which a gap filler is arranged, the bearing surface being formed on the shoulder portion, wherein the electronic component rests against the gap filler so that the printed circuit board is mounted in the housing via the electronic component and the gap filler, wherein the gap filler is thermally conductive, wherein the gap filler is adhesive so that the printed circuit board is bonded onto the bearing surface via the electronic component by means of the gap filler, wherein the electronic component is connected to the housing in a thermally conductive manner as the electronic component is directly coupled to the housing via the gap filler, as a result of which a heat conduction to the housing via the gap filler is established from which heat is released to the surroundings, a potting compound being provided, which covers at least an upper side of the printed circuit board and contacts the gap filler that serves as a rest for the potting compound, and wherein the gap filler stops coverage of the potting compound at the bearing surface.

2. The printed circuit board assembly according to claim 1, wherein the electronic component is fastened to the bearing surface by means of the gap filler.

3. The printed circuit board assembly according to claim 1, wherein the gap filler is elastic so that the gap filler acts as a mechanical damper.

4. The printed circuit board assembly according to claim 1, wherein the gap filler is made of an elastomer.

5. The printed circuit board assembly according to claim 1, wherein the gap filler is made of a thermoset material.

6. The printed circuit board assembly according to claim 5, wherein the gap filler is made of a polyurethane or an epoxide.

7. The printed circuit board assembly according to claim 1, wherein the gap filler is provided with a thermally conductive additive.

8. The printed circuit board assembly according to claim 7, wherein the thermally conductive additive is a ceramic powder or a mineral material.

9. The printed circuit board assembly according to claim 1, wherein the potting compound completely covers the upper side of the printed circuit board, which is opposite to a lower side of the printed circuit board to which the electronic component is fastened.

10. The printed circuit board assembly according to claim 1, wherein the potting compound seals the electronic component to the outside.

11. The printed circuit board assembly according to claim 1, wherein the bearing surface is parallel to the housing bottom.

12. The printed circuit board assembly according to claim 1, wherein the printed circuit board is mounted in the housing spaced apart from the sidewalls.

13. The printed circuit board assembly according to claim 1, wherein the printed circuit board and the at least one electronic component are disposed in the housing and spaced apart from the sidewalls of the housing to form a gap and where the potting compound fills the gap up to the gap filler.

14. The printed circuit board assembly according to claim 1, wherein the potting compound is partially located on the bearing surface, and the gap filler stops coverage of the potting compound over an entirety of the bearing surface.

15. A printed circuit board assembly for a field bus device, comprising a housing, a printed circuit board, and at least one electronic component fastened to the printed circuit board, the printed circuit board being arranged in the housing, the housing being formed in a pot shape and has a housing bottom and sidewalls, and the housing having at least one bearing surface being parallel to the housing bottom, wherein being parallel to the housing bottom, wherein a gap filler is arranged on the bearing surface, wherein the electronic component rests on the gap filler so that the printed circuit board is mounted in the housing via the electronic component and the gap filler, and wherein the gap filler is electrically non-conductive, wherein a potting compound is provided, wherein the electronic component is partially limited by the gap filler and the potting compound such that the potting compound contacts the electronic component, and wherein the potting compound covers an upper side of the printed circuit board and the gap filler stops coverage of the potting compound at the bearing surface.

16. The printed circuit board assembly according to claim 15, wherein the printed circuit board and the at least one electronic component are disposed in the housing and spaced apart from the sidewalls of the housing to form a gap and where the potting compound fills the gap up to the gap filler.

17. The printed circuit board assembly according to claim 15, wherein the potting compound is partially located on the bearing surface, and the gap filler stops coverage of the potting compound over an entirety of the bearing surface.

18. A printed circuit board assembly for a field bus device, comprising a housing, a printed circuit board, and at least one electronic component fastened to the printed circuit board, the printed circuit board being arranged in the housing, wherein the housing is formed in a pot shape and has a housing bottom and sidewalls, and the housing having at least one bearing surface on which a gap filler is arranged, against which the electronic component rests so that the printed circuit board is mounted in the housing via the electronic component and the gap filler, wherein the housing has a shoulder portion which is provided in a transition area from the housing bottom to at least one of the sidewalls, the bearing surface being formed on the shoulder portion such that the bearing surface is parallel to the housing bottom, wherein a potting compound is provided that covers an upper side of the printed circuit board and partially rests on the bearing surface formed on the shoulder portion where the potting compound contacts the gap filler and the gap filler stops coverage of the potting compound at the bearing surface.

19. The printed circuit board assembly according to claim 18, wherein the potting compound is partially located on the bearing surface, and the gap filler stops coverage of the potting compound over an entirety of the bearing surface.

20. The printed circuit board assembly according to claim 18, wherein the printed circuit board and the at least one electronic component are disposed in the housing and spaced apart from the sidewalls of the housing to form a gap and where the potting compound fills the gap up to the gap filler.

* * * * *